United States Patent [19]
Quiles

[11] Patent Number: 4,937,128
[45] Date of Patent: Jun. 26, 1990

[54] COMPOSITE SEAL WITH INCORPORATED CONDUCTOR

[75] Inventor: Georges Quiles, Bobigny, France

[73] Assignee: Societe Anonyme SAP Societe Automatique de Profilage, Gisors, France

[21] Appl. No.: 248,360

[22] Filed: Sep. 23, 1988

[30] Foreign Application Priority Data

Sep. 25, 1987 [FR] France .................. 87 13330

[51] Int. Cl.⁵ .............................................. E06B 7/22
[52] U.S. Cl. ..................................... 428/156; 49/498; 174/35 GC; 428/99; 428/188
[58] Field of Search ................ 49/498, 496; 428/99, 428/156, 188; 174/35 GC

[56] References Cited

U.S. PATENT DOCUMENTS

| | | | |
|---|---|---|---|
| 1,912,255 | 5/1933 | Clark | 49/493 |
| 3,783,173 | 1/1974 | Twomey | 174/35 GC |
| 4,260,655 | 4/1981 | Zoller | 428/31 |
| 4,327,351 | 4/1982 | Walker | 428/138 X |
| 4,343,845 | 8/1982 | Burden et al. | 428/122 |
| 4,656,807 | 4/1987 | Anhegger et al. | 428/99 X |
| 4,659,869 | 4/1987 | Busby | 174/35 GC |

Primary Examiner—Henry F. Epstein
Attorney, Agent, or Firm—Cushman, Darby & Cushman

[57] ABSTRACT

A composite seal comprises a metal strip and attached to the stip a profiled member of electrically conductive elastic material. At least one electrical conductor is disposed between the metal strip and the profiled member, which are bonded together by an adhesive applied in at least two longitudinal areas separate from the area containing the conductor or conductors. The profiled member incorporates longitudinal grooves equal in number to the conductor or conductors, each of which is partially inserted in a respective groove and laterally immobilized thereby. The conductor or conductors may be fixed to the profiled member inside the respective groove. The profiled member incorporates longitudinal grooves in each area to which adhesive is applied, and the metal strip has a roughened surface at least in the areas to which adhesive is applied.

5 Claims, 2 Drawing Sheets

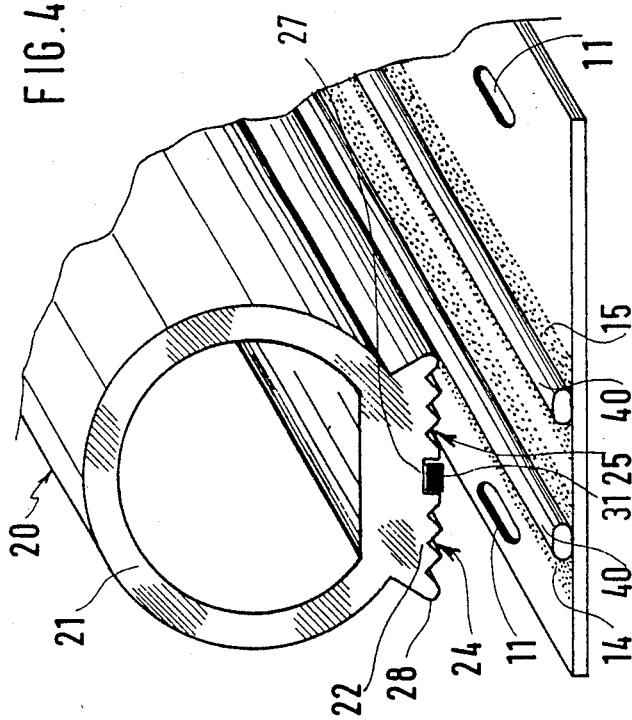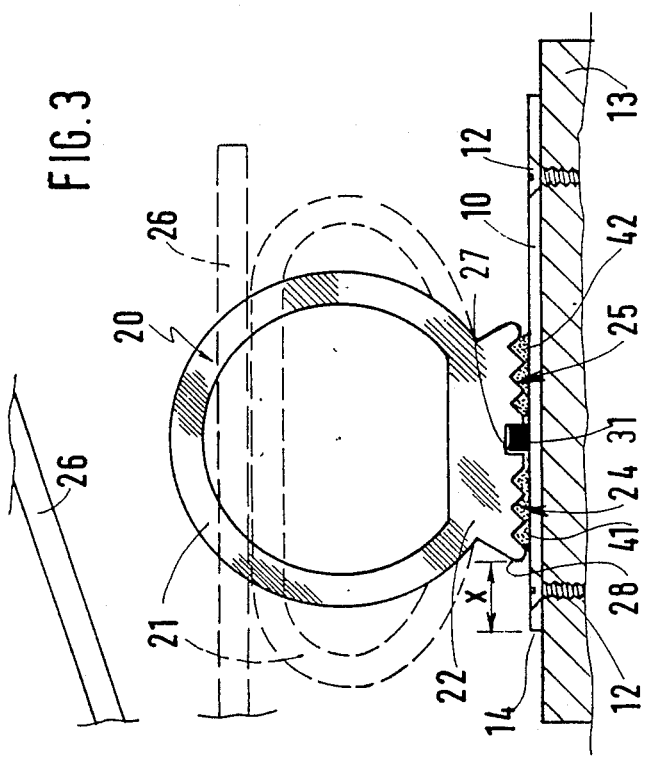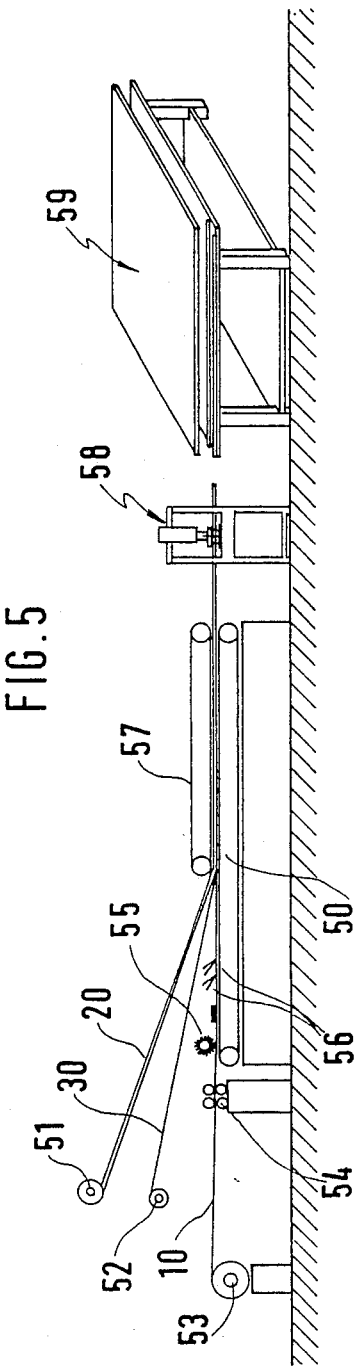

COMPOSITE SEAL WITH INCORPORATED CONDUCTOR

BACKGROUND OF THE INVENTION

1. Field of the Invention

The invention concerns composite seals with incorporated conductor.

2. Description of the Prior Art

It is sometimes necessary to fit elastic seals between two parts movable relative to each other, to obtain insulation or a seal. This is the case with refrigerator doors, for example.

In some applications these seals have to adapt to specific conditions of use, over and above their inherent qualities specific to their sealing function.

As is well known, for example, electronic equipment cabinets and cases, especially those of computers, acquire an electrostatic charge due to the functioning of the system that they contain and this static electricity has to be eliminated by conducting it to ground. This presupposes electrical continuity between all the associated parts: chassis, frame, support, cabinet or case. These cabinets and cases are equipped with access doors which have to receive a seal to protect the electronic system, in particular against dust in the atmosphere. If the seals are electrically insulative there is an electrical discontinuity between the cabinet and the door, as a result of which the functioning of the system may be seriously disturbed.

To avoid this seals are used that are both elastic and electrically conductive. Their manufacture has drawbacks, however.

Seals of this kind generally comprise two parts: a substantially rigid support, for example a strip of stainless steel, and a seal proper consisting of an elastic profiled member. The combination of these two heterogeneous parts presents difficulties because they cannot be glued since the adhesives currently known for this purpose are electrically insulative and prevent the electrical continuity that is an essential requirement.

To overcome this problem the profiled member is fixed to the strip without adhesive and fixing is obtained by extruding the profiled member onto the moving metal strip with the profiled member stabilized when it is applied to the strip. In practice the profiled member is made from silicone rubber and the strip/profiled member combination is passed through a vulcanizing oven.

In this way intimate and direct contact is obtained between the two conductive parts and the electrical problem is solved because there is no insulative intermediary.

It is evident that this manufacturing process has drawbacks because on the one hand the process is in itself difficult to execute using skilled labor and on the other hand it requires a complex installation, consuming large quantities of energy (the vulcanizing oven has to be heated to approximately 240° Centigrade), all this resulting in a high unit cost.

The present invention remedies these disadvantages by providing an elastic seal with good electrical conductivity obtained by simple assembly of a pre-formed elastic profiled member to a metal strip.

SUMMARY OF THE INVENTION

The present invention involves a composite seal comprising a metal strip and attached thereto a profiled member of electrically conductive elastic material and at least one conductor disposed between said metal strip and said elastic profiled member which are bonded together by an adhesive applied in at least two longitudinal areas separate from the area containing the at least one conductor.

In accordance with other characteristics of the invention, the elastic profiled member incorporates longitudinal grooves equal in number to the conductor or conductors, each of which is partially inserted in a respective groove and laterally immobilized thereby;

the at least one conductor is fixed to the elastic profiled member inside the respective groove;

the elastic profiled member incorporates longitudinal grooves in each area to which adhesive is applied; and the metal strip has a roughened surface at least in the areas to which adhesive is applied.

The invention will be better understood from the following detailed description given by way of non-limiting example only with reference to the appended drawings.

BRIEF DESCRIPTION OF THE DRAWINGS

FIG. 3 is a schematic view in cross-section of a second embodiment of a seal in accordance with the invention.

FIG. 4 is a partial schematic view in perspective of the seal from FIG. 2.

FIG. 5 is a schematic profile view of an installation for manufacturing a seal in accordance with the invention.

DESCRIPTION OF THE PREFERRED EMBODIMENTS

Figure 1:
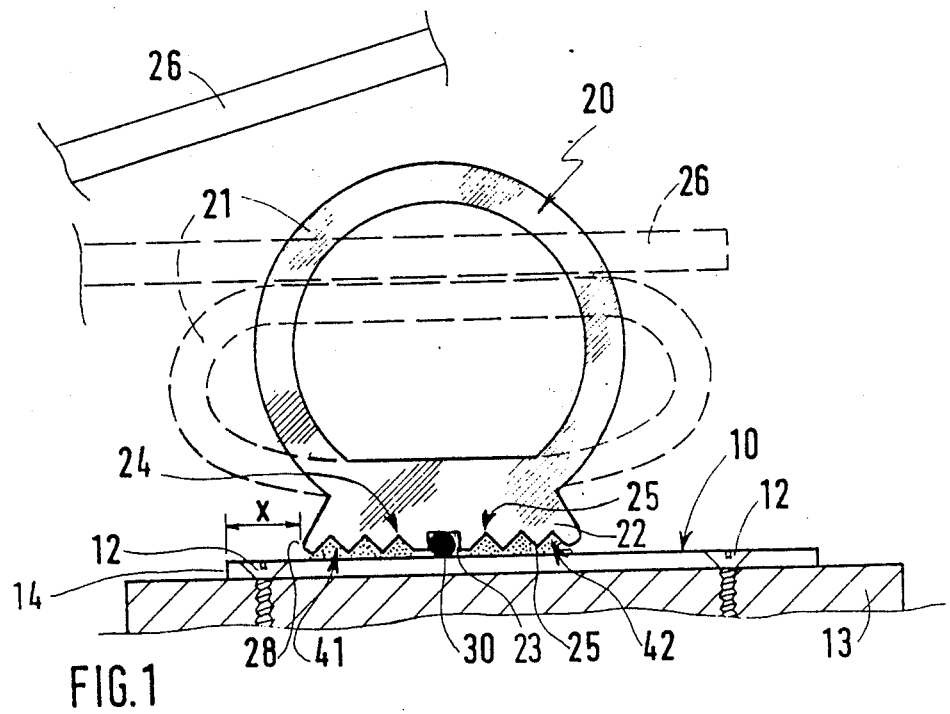
FIG. 1 is a schematic view in cross-section of a first embodiment of a seal in accordance with the invention.
Figure 2:
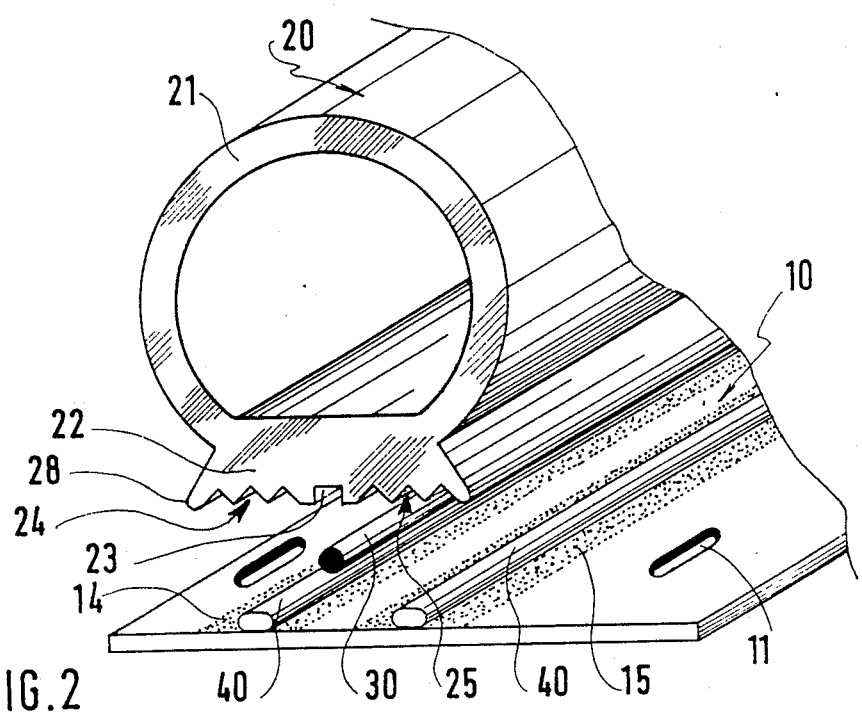
FIG. 2 is a partial schematic view in perspective of the seal from FIG. 1.

Referring to FIGS. 1 and 2, it is seen that a seal in accordance with the invention comprises a stainless steel strip 10, a silicone rubber profiled member 20, an electrically conductive wire 30 and an adhesive 40 disposed along two areas 41 and 42 to either side of the conductive wire 30.

The strip 10 includes slots 11 for screws 12 to pass through to fix it to a part 13 such as a cabinet containing electronic systems.

The strip 10 has a roughened surface along two areas 14 and 15 symmetrically disposed relative to its longitudinal axis.

The profiled member 20, made by extrusion, for example, has a hollow specifically flexible part 21 of generally tubular cross-section and a base 22 for fixing it to the strip 10.

The base 22 has a longitudinal groove 23 to each side of which are two series of longitudinal grooves 24 and 25.

Adhesive 40 is applied in two beads to the areas 14 and 15 and the electrically conductive wire 30 is placed along the axis of the strip 10 and inserted into the groove 23 in the profiled member 20.

By relative pressure between the strip 10 and the profiled member 20 the beads of adhesive 40 are spread over all the areas 14 and 15 and fill the grooves 24 and 25. Because the metal of the strip 10 has a roughened surface in the areas 14 and 15, the adhesive is strongly applied and holds the profiled member 20 onto the strip 10, the electrically conductive wire 30 being held constantly in contact with the strip 10 and the profiled member 20.

This strong fixing guarantees permanent contact of the electrically conductive wire 30 between the strip 10 and the profiled member 20 and provides electrical continuity between the cabinet 13 and a pivotting door schematically represented at 26. FIG. 1 shows that in the closed position of the door 26, shown in dashed line, the tubular part 21 is deformed whereas the base 22 remains intact.

FIGS. 3 and 4 show another embodiment of the invention with parts which are the same as in FIGS. 1 and 2 carrying the same reference numbers. In this embodiment the base 22 has a longitudinal groove 27 the shape of which is adapted to receive an electrically conductive member 31 which in this instance has a rectangular cross-section for securing it into the groove 27.

In this way a slightly different manufacturing process may be used, as will be explained later.

To manufacture the seal in accordance with the invention that has just been described with reference to FIGS. 1 and 2 the following procedure may be employed (see FIG. 5):

These operations are carried out continuously on a lower endless belt 50. At the upstream end of the belt 50 are a pay-out unit 51 for the profiled member 20 previously extruded and stored on spools, a pay-out unit 52 for the electrically conductive wire 30 and a pay-out unit 53 for the strip (or tape) 10.

These three elements are in a "side by side" association:

The strip 10 is driven by motorized rollers 54 and is laid onto the belt 50 where it is roughened by a rotating grinder 55 in the two areas 14 and 15 and is then cleaned by a wiping pad impregnated with a dry solvent (not shown).

The two beads of adhesive 40 are deposited on the strip 10 by means of calibrated nozzles 56 to which the paste-like adhesive is supplied under pressure by a pump. The two beads are accurately deposited on the strip 10 to be under the longitudinal grooves 24 and 25.

The profiled member 20 is taken off its spool situated in the pay-out unit 51 and is applied to the strip 10 by guides (not shown). This guidance has to be very accurate so that the grooves 24 and 25 are applied to the adhesive beads 41 and 42 and so that the edge 28 of the base 22 is always at a distance x from the edge 14 of the strip 10. In this way the longitudinal axis of the profiled member 20 is always at the same distance from the edge 14.

An upper belt 57 is driven synchronously with the lower belt 50. Together they provide the necessary pressure between the profiled member 20 and the metal strip 10. The beads of adhesive 40 are then crushed and the adhesive is spread into the grooves 24 and 25 to form as thin a film as possible.

The compression of the combination 10-20-30-40 between the belts 50 and 57 enables the electrically conductive wire 30 to be inserted and drawn into the groove 23.

The beads of adhesive 40 are sized so that they do not spread outside the profiled member 20 or, most importantly, towards the center, where the electrically conductive wire 30 is located, in order to avoid any insulative effect.

The time for the adhesive to set depends on the nature of the adhesive used and may vary according to polymerization conditions that are well-known in themselves: ambient temperature, relative humidity, use of a tunnel, etc. This time is generally between 3 and 25 minutes.

At the exit from the belts 50 and 57 the combination passes into a cutting machine 58 and the successive segments are gathered on a preliminary storage table 59.

The seal from FIGS. 3 and 4 differs from that of FIGS. 1 and 2 in that the conductor 31 is partially inserted and immobilized in the groove 27 in the base 22 before the latter is bonded to the strip 10.

To fix the conductor 31 it may be fitted during extrusion of the profiled member 20, fixing then being obtained by natural adhesion of the extruded material onto the metal conductor 31.

The benefit of this process is that it eliminates the need for guidance of the electrically conductive wire when bonding the profiled member onto the strip 10.

The characteristics of the materials from which the profiled member 20, the strip 10, the conductor 30-31 and the adhesive 40 are made have not been described in detail here as they are within the normal competence of those skilled in the art.

There is claimed:

1. A composite seal being both elastic and conductive, comprising:
    a metal strip;
    a profiled member of electrically conductive elastic material;
    at least one conductor disposed between said metal strip and said profiled member and longitudinally contacting both; and
    an adhesive bonding said metal strip to said profiled member, said adhesive being applied in at least two longitudinal areas separate from an area where said at least one conductor is located.

2. A seal according to claim 1, wherein said profiled member incorporates longitudinal grooves equal in number to the conductor or conductors, each of which is partially inserted in a respective groove and laterally immobilized thereby.

3. A seal according to claim 2, wherein said at least one conductor is fixed to said profiled member inside the respective groove.

4. A seal according to claim 1, wherein said profiled member incorporates longitudinal grooves in each area to which adhesive is applied.

5. A seal according to claim 1, wherein said metal strip has a roughened surface at least in said areas to which adhesive is applied.

* * * * *